United States Patent [19]

Hamai

[11] Patent Number: 5,148,263
[45] Date of Patent: Sep. 15, 1992

[54] SEMICONDUCTOR DEVICE HAVING A MULTI-LAYER INTERCONNECT STRUCTURE

[75] Inventor: Tsuneo Hamai, Fujisawa, Japan

[73] Assignee: Kabushiki Kaisha Toshiba, Kawasaki, Japan

[21] Appl. No.: 684,151

[22] Filed: Apr. 12, 1991

Related U.S. Application Data

[63] Continuation of Ser. No. 448,360, Dec. 11, 1989, abandoned.

[30] Foreign Application Priority Data

Dec. 16, 1988 [JP] Japan .................. 63-318245

[51] Int. Cl.$^5$ .............. H01L 23/48; H01L 29/46; H01L 29/54; H01L 29/62
[52] U.S. Cl. .................. 357/71; 357/51; 357/53; 357/68
[58] Field of Search .............. 357/71, 68, 65, 51, 357/53

[56] References Cited

U.S. PATENT DOCUMENTS 4,893,170  1/1990  Tokuda et al. .................. 357/71

FOREIGN PATENT DOCUMENTS 0259631  3/1988  European Pat. Off. .
0307722  3/1989  European Pat. Off. .

OTHER PUBLICATIONS

"Semiconductor Integrated Circuit Device", Patent Abstracts of Japan, vol. 10, No. 205 (E-420) (2261) Jul. 17, 1986, & JP-A-61 046050 (NEC IC Microcomput Syst Ltd) Mar. 6, 1986.
Patent Abstracts of Japan, vol. 11 No. 59 (E-482) (2506) Feb. 24, 1987, & JP-A-61 218155, Sep. 27, 1986.

*Primary Examiner*—Rolf Hille
*Assistant Examiner*—David Ostrowski
*Attorney, Agent, or Firm*—Finnegan, Henderson Farabow, Garrett and Dunner

[57] ABSTRACT

A semiconductor device has a multi-layer structure comprising three or more interconnect layers formed over a substrate, one of these interconnect layers being a first power supply line and another metal interconnect layer being a second power supply line, the first and second power supply lines being arranged in a multi-level fashion such that one is superposed relative to the other in a plan view. That is, the power supply lines are arranged as a multi-layer metal interconnect layer array such that the first and second power supply lines are superposed in a multi-level fashion in a plan view.

3 Claims, 2 Drawing Sheets

SEMICONDUCTOR DEVICE HAVING A MULTI-LAYER INTERCONNECT STRUCTURE

This application is a continuation of application Ser. No. 07/448,360, filed Dec. 11, 1989, now abandoned.

BACKGROUND OF THE INVENTION

1. Field of the Invention

The present invention relates to a semiconductor device having a multi-layer interconnect metal structure made up of three or more layers and, in particular, to the layout of main power supply lines for a semiconductor device of multi-layer interconnect metal structure.

2. Description of the Related Art

FIG. 1 is a plan view showing a conventional multi-layer interconnect pattern Reference numeral 1 denotes an IC chip whose power supplies $V_{DD}$ and GND are connected to a power supply pad 2 and ground pad 3, respectively, and are also connected to closed-loop patterns (power supply line patterns) 6 and 7, respectively, via a second metal layer (Al) 4 and first metal layer (Al) 5. The closed-loop patterns 6 and 7 are formed of the same material as that of the second metal layer (left-inclined hatched area in FIG. 1) in which case due consideration is paid to input/output signal lines 9, 10, and 11 coming from a logic block 8. The input/output signal lines 9, 10, and 11 coming from the logic block 8 are formed of the same material as the first metal layer (interconnect pattern without a hatched area) and provide a multi-level crossing relative to the power supply line patterns 6 and 7. Signal lines 9, 10, and 11 are connected to an input pad 12, output pad 13, and logic block 14, respectively.

In the conventional semiconductor device, elements, such as transistors, are not formed at a pattern area between an interconnect pad and a logic block, or at a pattern area between a logic block and another logic block, this being because the pattern areas are used as interconnect areas for power supply lines and signal lines. On the other hand, the pattern width of the power supply lines 6 and 7 needs be broadened due to a need for more current flow in which case the size of the chip 1 is increased, for example, due to an increase in the number of transistors in the chip 1 and hence an increase in dissipation current in the chip 1. Such an increase in the size of the chip 1 results in an increase in the size of the interconnect area between the pad and the logic block and between the logic blocks. This prevents an increase in the integration density of transistors and hence a reduction in the chip size. That is, even if the integration density of the transistors is to be increased, there is no significant decrease in the area taken up by the power supply lines; rather, an increase in the number of transistors results in an increase in the width of the power supply lines. Consequently, no substantial reduction in the chip size is possible.

SUMMARY OF THE INVENTION

Accordingly, it is an object of the present invention is to solve the aforementioned drawbacks by providing a semiconductor device in which the area taken up by two or more types of power supply lines within a semiconductor chip is reduced.

According to the present invention, a semiconductor device of a multi-layer structure is provided wherein the element area required is reduced and a power supply line noise is reduced by a capacitor component between the power supply lines.

DETAILED DESCRIPTION OF THE PREFERRED EMBODIMENT

A semiconductor device according to the embodiment of the present invention will now be explained below, with reference to the accompanying drawings.

Figure 1:
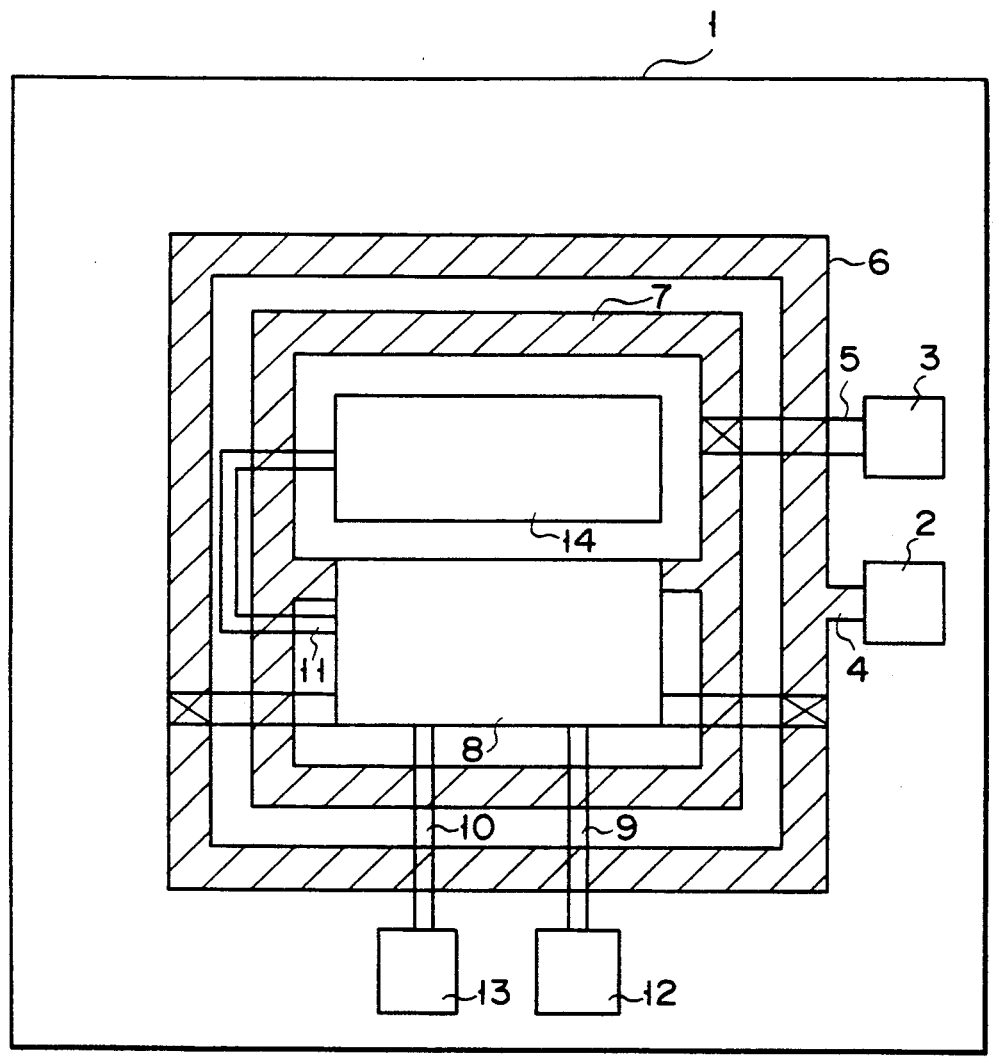
FIG. 1 is a plan view of an interconnect pattern of a conventional semiconductor device.
Figure 2:
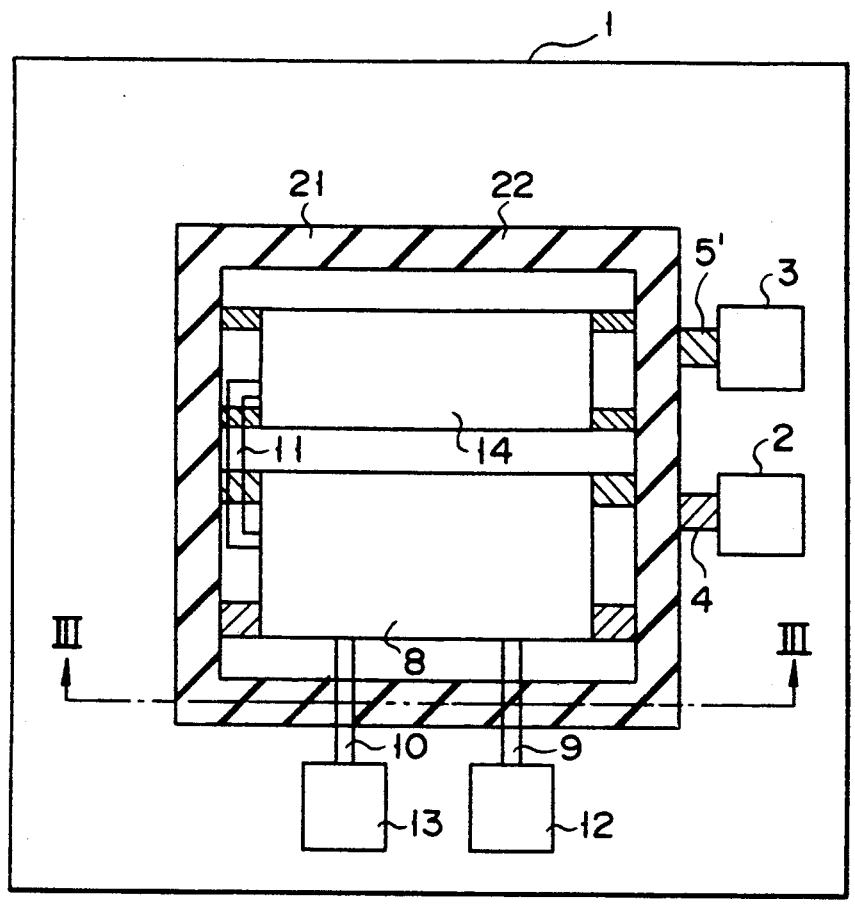
FIG. 2 is a plan view of an interconnect pattern of a semiconductor device according to an embodiment of the present invention.

FIG. 2 is a plan view of an interconnect pattern of a semiconductor device according to the embodiment of the present invention. Identical reference numerals are employed in FIG. 2 to designate parts or components corresponding to those shown in FIG. 1.

As is shown in FIG. 2, closed-loop power supply line patterns 21 and 22 over a chip 1 are of such a type that a second metal layer (for example, Al) as indicated by a left-inclined hatched area and third metal layer (for example, Al) as indicated by right-inclined hatched area are independently and three-dimensionally formed in a superposed fashion in a plan view. A power supply $V_{DD}$ is connected to a power supply pad 2 and connected by, for example, a second metal layer 4 to the closed-loop power supply line pattern 21. A power supply GND is connected to the power supply pad 3 and connected by, for example, a third metal layer 5' to the closed-loop power supply line pattern 22. Input/output signal lines 9 to 11 coming from a logic block 8 are formed of a first metal layer as indicated by a non-hatched area and provided, as a multi-level crossing, relative to the power supply lines 21 and 22. The input/output signal lines 9, 10, and 11 are connected to an input pad 12, output pad 13, and logic block 14, respectively.

Figure 3:
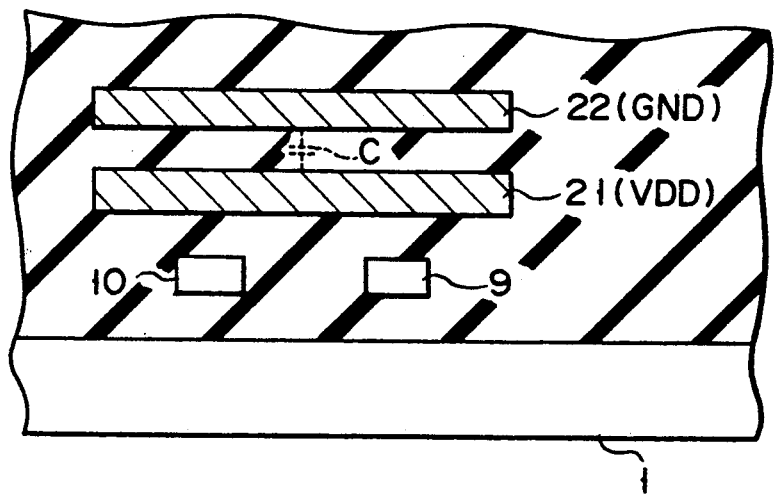
FIG. 3 is a schematic view, as taken in line III—III in FIG. 2, of the embodiment of the present invention.

FIG. 3 is a cross-sectional view of the power supply line interconnect pattern area shown in FIG. 2. An input/output signal line 9 is formed as the first metal layer, this being the lowermost layer, the power supply line pattern ($V_{DD}$ power supply) 21 is formed as the second metal layer, one level higher than that of the first metal layer, and the power supply line pattern 22 (GND power supply) is formed as the third metal layer, or the topmost layer, over the second metal layer. Formed thus, the respective layers are not electrically connected to each other, since they are insulated from each other even if being connected in a multi-level fashion.

The $V_{DD}$ power supply line 7 and GND power supply line 6, which are formed in parallel fashion with one of these power supply lines spaced from the other in a plan view in the conventional semiconductor device, can be superposed in a three-dimensional array, thus reducing the size of the pattern area as viewed from a plan view. As an added advantage, it is possible to reduce the amount of power supply noise caused, for example, by the simultaneous switching of the greater number of transistors contained in the chip, because a capacitor C of parallel flat sheet configuration, is created between the $V_{DD}$ and the GND.

The present invention, when applied not only to a main power supply between the logic block and the pad but also to a main line between the logic blocks, obtains the same advantage as set forth above. Although the embodiment of the present invention has been explained in connection with the three-layer metal interconnect structure, the same advantage can be obtained if the structure has three or more layers. In this case, a plurality of metal interconnect layers may be employed for a single power supply. Furthermore, the metal interconnect layers 21 and 22 and signal interconnect layers 9 to 11 may be arranged one over another in a proper multi-level fashion.

What is claimed is:

1. A semiconductor device having a multi-layer metal interconnect structure comprising:
    at least three metal interconnect layers formed over a substrate;
    a first metal interconnect layer constituting a first power supply line, wherein said first power supply line comprises a plurality of interconnect layers; and
    a second metal interconnect layer vertically aligned with and separated from the first metal interconnect layer, and constituting a second power supply line.
    the first and second power supply lines each being a closed trunk line for applying voltages to said device.

2. A semiconductor device having a multi-layer metal interconnect structure comprising:
    at least three metal interconnect layers formed over a substrate;
    a first metal interconnect layer constituting a first power supply line; and
    a second metal interconnect layer vertically aligned with and separated from the first metal interconnect layer, and constituting a second power supply line, wherein said second power supply line comprises a plurality of interconnect layers,
    the first and second power supply lines each being a closed trunk line for applying voltages to said device.

3. A semiconductor device having a multi-layer metal interconnect structure comprising:
    at least three metal interconnect layers formed over a substrate;
    a first metal interconnect layer constituting a first power supply line; and
    a second metal interconnect layer vertically aligned with and separated from the first metal interconnect layer, and constituting a second power supply line,
    the first and second power supply lines each being a closed trunk line for applying voltages to said device, and wherein said first and second power supply lines each comprise a plurality of interconnect layers.

* * * * *

UNITED STATES PATENT AND TRADEMARK OFFICE
CERTIFICATE OF CORRECTION

PATENT NO.  : 5,148,263
DATED       : September 15, 1992
INVENTOR(S) : Tsuneo Hamai It is certified that error appears in the above-identified patent and that said Letters Patent is hereby corrected as shown below:

Claim 1, column 3, line 27, change "line" to --line,--.

Signed and Sealed this

Sixteenth Day of November, 1993

*Attest:*

BRUCE LEHMAN

*Attesting Officer*    *Commissioner of Patents and Trademarks*